United States Patent
Saito et al.

(10) Patent No.: US 7,122,896 B2
(45) Date of Patent: Oct. 17, 2006

(54) MOUNTING STRUCTURE OF ELECTRONIC COMPONENT, ELECTRO-OPTIC DEVICE, ELECTRONIC EQUIPMENT, AND METHOD FOR MOUNTING ELECTRONIC COMPONENT

(75) Inventors: Atsushi Saito, Chino (JP); Shuichi Tanaka, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/914,121

(22) Filed: Aug. 10, 2004

(65) Prior Publication Data

US 2005/0062153 A1    Mar. 24, 2005

(30) Foreign Application Priority Data

Aug. 21, 2003 (JP) ............................. 2003-297654
Jun. 23, 2004 (JP) ............................. 2004-184946

(51) Int. Cl.
H01L 23/48 (2006.01)
H01L 29/40 (2006.01)
B23K 31/02 (2006.01)

(52) U.S. Cl. ................ 257/738; 257/737; 257/778; 257/789; 257/793; 257/E23.021; 228/180.22; 438/613

(58) Field of Classification Search .............. None
See application file for complete search history.

(56) References Cited

U.S. PATENT DOCUMENTS

| | | | | |
|---|---|---|---|---|
| 5,017,420 A | * | 5/1991 | Marikar et al. ............. 428/212 |
| 5,431,328 A | * | 7/1995 | Chang et al. ........... 228/180.22 |
| 5,477,087 A | * | 12/1995 | Kawakita et al. ............ 257/737 |
| 5,861,661 A | * | 1/1999 | Tang et al. .................. 257/668 |
| 5,925,930 A | * | 7/1999 | Farnworth et al. .......... 257/737 |
| 5,956,235 A | * | 9/1999 | Kresge et al. ............... 361/774 |
| 6,063,647 A | * | 5/2000 | Chen et al. ................. 438/108 |
| 6,073,829 A | * | 6/2000 | Pienimaa ............... 228/180.22 |

FOREIGN PATENT DOCUMENTS

| | | | | |
|---|---|---|---|---|
| JP | 1-158743 | * | 6/1989 | .................. 257/738 |
| JP | 4-315137 | * | 11/1992 | .................. 349/57 |
| JP | A 5-182516 | | 7/1993 | |
| JP | A-09-293753 | | 11/1997 | |
| JP | A-10-173006 | | 6/1998 | |
| JP | 2001-217268 | | 8/2001 | |
| JP | A-2002-043558 | | 2/2002 | |
| JP | A-2002-134541 | | 5/2002 | |

* cited by examiner

Primary Examiner—Jasmine Clark
(74) Attorney, Agent, or Firm—Oliff & Berridge, PLC

(57) ABSTRACT

To provide a low cost mounting structure of an electronic component and to increase the reliability of the conductive connection between a bump electrode and a terminal formed on a substrate, in the mounting structure of the electronic component, the bump electrode includes a core composed of an inner resin and a conductive film covering the surface of the core. The bump electrode is brought into conductive contact with the terminal directly and is elastically deformed to make contact with the face of the substrate in a planar manner. A sealing resin is filled in around the conductive contact portion between the bump electrode and the terminal to hold the bump electrode and the terminal.

21 Claims, 9 Drawing Sheets

F I G. 4
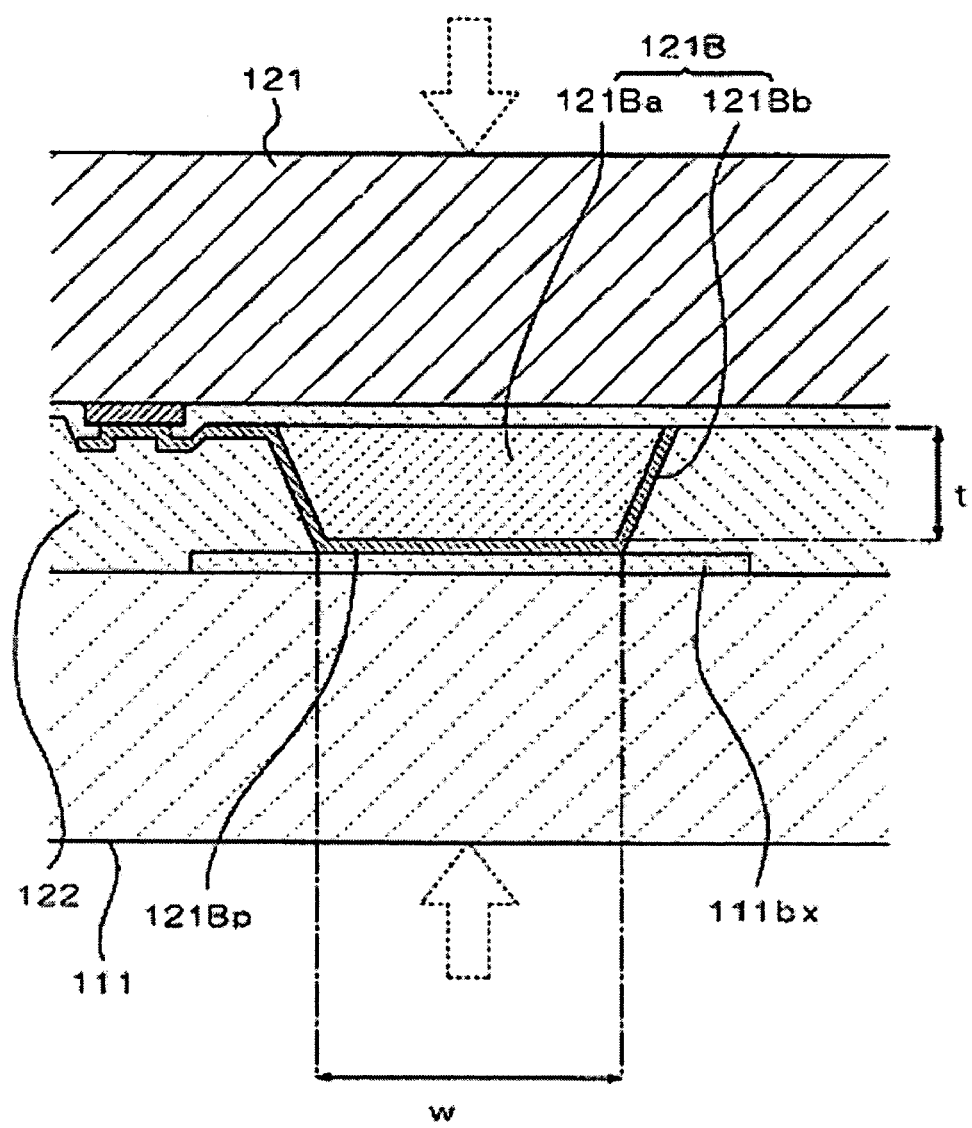

(BEFORE MOUNTING)

MOUNTING STRUCTURE OF ELECTRONIC COMPONENT, ELECTRO-OPTIC DEVICE, ELECTRONIC EQUIPMENT, AND METHOD FOR MOUNTING ELECTRONIC COMPONENT

BACKGROUND OF THE INVENTION

1. Field of Invention

Exemplary aspects of the present invention relate to a mounting structure of electronic components, electro-optic devices, electronic equipment, and a method for mounting electronic components, and in particular, to a mounting structure and a method for mounting in which an electronic component having bumps is mounted on terminals composed of a transparent conductor formed on a glass substrate.

2. Description of Related Art

A related art technology for mounting an electronic component, such as a semiconductor IC, has been used in a circuit board that is installed in-various kinds of electronic equipment or a liquid crystal display device. For example, a related art liquid crystal-driving IC chip to drive a liquid crystal panel is mounted in a liquid crystal display device. This liquid crystal-driving IC chip is directly mounted on a glass substrate in the liquid crystal panel. Alternatively, this liquid crystal-driving IC chip is mounted on a flexible printed circuit (FPC) that is mounted on the liquid crystal panel. The former mounting structure is referred to as a chip on glass (COG) structure and the latter structure is referred to as a chip on FPC (COF) structure.

In the production of a related art liquid crystal display device having the COG structure, an IC chip is mounted as follows. As shown in FIG. 11, a liquid crystal-driving IC chip 21 is disposed on an array portion of indium tin oxide (ITO) terminals 11*bx* and 11*dx* composed of a transparent conductor on a glass substrate 11 through an anisotropic conductive film (ACF) 22 in which conductive particles 22*a* are dispersed in a thermosetting resin 22*b*. Metal bump electrodes 21B disposed on the liquid crystal-driving IC chip 21 are brought into conductive contact with the ITO terminals 11*bx* and 11*dx* on the glass substrate 11 through the conductive particles 22*a* by pressing the liquid crystal-driving IC chip 21 while heating. This conductive contact is maintained with the cured thermosetting resin 22*b*.

SUMMARY OF THE INVENTION

In general, in order to increase the reliability of the conductive connection between the metal bump electrodes 21B on the liquid crystal-driving IC chip 21 and the ITO terminals 11*bx* and 11*dx* on the glass substrate 11, the conductive particles 22*a* disposed therebetween must be elastically deformed by pressing to some extent. The reason for this is that even if the thermosetting resin 22*b* is thermally expanded to some extent by a temperature change, the conductive contact through the conductive particles 22*a* must be maintained. In general, however, it is very difficult to provide the conductive particles 22*a* with a sufficient amount of elastic deformation so as to enhance the reliability of the conductive connection. Therefore, in a method for increasing the reliability of the conductive connection, the use of conductive particles composed of a conductive rubber is disclosed in, for example, Japanese Unexamined Patent Application Publication No. 5-182516.

Because of the high fineness and colorization of related art liquid crystal display devices, pitches between the metal bump electrodes 21B and between the ITO terminals 11*bx* and 11*dx* has become smaller. Accordingly, the diameter of the conductive particle 22*a* also has become smaller in order to reduce or prevent short-circuiting between the adjacent electrodes or the adjacent terminals. This increases the cost of the ACF 22, and therefore, increases the production cost. In addition, since it is more difficult to provide the conductive particles 22*a* with sufficient elastic deformation, providing electrical reliability during a temperature change becomes difficult. Furthermore, in the above method using the conductive particles composed of a conductive rubber, it is more difficult to form the conductive rubber having a fine diameter so as to match with the above-described small pitch. Unfortunately, this method further increases the production cost.

Accordingly, in order to address or solve the above and/or other problems, an exemplary aspect of the present invention provides a mounting structure of an electronic component to increase the reliability of the conductive connection between a bump electrode and a terminal formed on a substrate. The mounting structure is formed at low cost. Furthermore, an exemplary aspect of the present invention provides an electro-optic device in which both high electrical reliability and low production cost are achieved using this mounting structure of an electronic component.

In order to address or achieve the above and/or other advantages, as a result of various studies, the present inventors have found the following mounting structure of an electronic component. According to the mounting structure, a bump electrode includes a core composed of an elastic inner resin and a conductive film covering the surface of the core. This mounting structure enhances the reliability of the conductive connection between the bump electrode and a terminal formed on a substrate, and can be formed at low cost.

An exemplary aspect of the present invention provides a mounting structure of an electronic component where the electronic component having a bump electrode is mounted on a substrate having a terminal. The bump electrode includes a core composed of an inner resin and a conductive film covering the surface of the core. The bump electrode is brought into conductive contact with the terminal directly and the bump electrode is elastically deformed to make contact with the face of the substrate in a planar manner. A sealing resin is filled in around the conductive contact portion between the bump electrode and the terminal to hold the bump electrode and the terminal.

As described above, since the bump electrode includes the core composed of the elastic inner resin, the bump electrode readily becomes in a state of elastic deformation by pressing on the terminal on the substrate. The elastic deformation of the bump electrode is held by the sealing resin filled in around the conductive contact portion. Since the bump electrode in the state of elastic deformation is contacted with the face of the substrate in a planar manner, the resilience (i.e., repulsive force) to the substrate is constantly generated in the bump electrode. Accordingly, this structure provides a sufficient conductive contact and high electrical reliability. Furthermore, since this mounting structure does not require an expensive material, such as an anisotropic conductive film or an anisotropic conductive adhesive, the production cost is decreased.

According to an exemplary aspect of the present invention, the bump electrode is brought into conductive contact with the terminal directly. The bump electrode may be elastically deformed by pressing in the contact direction in the temperature range from +80° C. to +300° C.

Since the bump electrode is pressed in the temperature range from +80° C. to +300° C., the elastic deformation of the inner resin is increased. Therefore, the elastic deformation is satisfactorily maintained. This structure provides a sufficient conductive contact and high electrical reliability.

According to an exemplary aspect of the present invention, the bump electrode is brought into conductive contact with the terminal directly. The bump electrode may be elastically deformed by pressing in the contact direction in the temperature range at least from −40° C. to +80° C.

Since the elastic deformation of the bump electrode is maintained in the temperature range at least from −40° C. to +80° C., a sufficient conductive contact is provided in the general operating temperature range. Accordingly, high electrical reliability is achieved.

According to an exemplary aspect of the present invention, mathematical formula 1 may be satisfied in the temperature range at least from −40° C. to +80° C.:

Mathematical Formula 1

$$\Delta t > \int_{To}^{To+\Delta T} \Delta \alpha t \, dT$$

where $\Delta\alpha$ represents the difference in the thermal expansion coefficient calculated by subtracting the thermal expansion coefficient $\alpha$ of the inner resin from the thermal expansion coefficient $\alpha'$ of the sealing resin; t represents a height of the inner resin at a reference temperature To set in the temperature range from −40° C. to +80° C.; $\Delta t$ represents an elastic deformation of the bump electrode at the reference temperature To; and $\Delta T$ represents the difference in temperature calculated by subtracting the reference temperature To from a certain temperature T.

In this case, the difference in the thermal expansion between the inner resin having a height t and the sealing resin caused by a temperature change is less than the elastic deformation $\Delta t$. Therefore, even if the temperature is changed in the above temperature range, the elastic deformation of the bump electrode is maintained. When the difference $\Delta\alpha=\alpha'-\alpha$ in the thermal expansion coefficient does not depend on the temperature T, the above formula is represented by formula $\Delta t > \Delta\alpha \cdot t \cdot \Delta T$.

According to an exemplary aspect of the present invention, the thermal expansion coefficient $\alpha'$ of the sealing resin may be larger than the thermal expansion coefficient a of the inner resin.

In this case, the thermal expansion of the sealing resin is larger than or equal to the thermal expansion of the inner resin. Even if the temperature is decreased, the elastic deformation of the bump electrode is not decreased. Therefore, the conductive contact between the bump electrode and the terminal is reliably maintained. Accordingly, the electrical reliability at a temperature lower than the temperature during pressing by heating is further enhanced. In this case, the elastic deformation of the bump electrode is provided at the maximum temperature in the operating temperature range. Consequently, the elastic deformation of the bump electrode can be maintained for the entire temperature range lower than the above maximum temperature.

According to an exemplary aspect of the present invention, the thermal expansion coefficient $\alpha$ of the inner resin may be larger than the thermal expansion coefficient $\alpha'$ of the sealing resin. In addition, the repulsive force to suppress the expansion of the inner resin during pressing with heat may be larger than the contractive force of the inner resin at the reference temperature To.

In this case, the thermal expansion of the inner resin is larger than or equal to the thermal expansion of the sealing resin. Even if the temperature is increased, the elastic deformation of the bump electrode is not decreased. Therefore, the conductive contact between the bump electrode and the terminal is reliably maintained. Accordingly, the electrical reliability in high temperature environment is further enhanced. In this case, the elastic deformation of the bump electrode is provided at the minimum temperature in the operating temperature range. Consequently, the elastic deformation of the bump electrode can be reliably maintained for the entire temperature range higher than the above minimum temperature.

According to an exemplary aspect of the present invention, formula 200 [MPa]·t'/E>$\Delta t$ may be satisfied in the temperature range at least from −40° C. to +80° C., wherein E represents the compression modulus of the inner resin and t' represents the initial height of the inner resin. In this case, the stress between the bump electrode and the substrate, which is caused by the elastic deformation $\Delta t$, i.e., the stress $\sigma$ represented by formula $\sigma=\epsilon E=(\Delta t/t)E$ (wherein $\epsilon$ represents strain) can be maintained less than 200 [MPa]. Accordingly, problems, for example, the breaking of the base structure due to the elastic deformation $\Delta t$ of the bump electrode, can be reduced or prevented.

According to an exemplary aspect of the present invention, the compression modulus E of the inner resin during pressing into contact may be 10 to 100 MPa. When the compression modulus E is within the above range, sufficient elastic deformation $\Delta t$ for to maintain the elastic deformation state in the temperature range (from +80° C. to +300° C.) during pressing with heat is provided. Furthermore, in the above temperature range, sufficient contact pressure between the bump electrode and the terminal is provided without problems, such as the breaking of the inner conductive film due to excessive deformation. Accordingly, electrical reliability is provided. In addition, the deformation can be controlled within the range of elastic deformation.

According to an exemplary aspect of the present invention, the compression modulus E of the inner resin during pressing into contact may be 100 to 15,000 MPa. When the compression modulus E is within the above range, sufficient elastic deformation $\Delta t$ for maintaining the elastic deformation state in the general operating temperature range (from −40° C. to +80° C.) is reliably provided by applying a stress less than 200 MPa. Accordingly, electrical reliability is provided. Also, problems due to an excessive stress can be reduced or prevented. When the compression modulus E exceeds 15,000 MPa, it is difficult to provide sufficient elastic deformation $\Delta t$. In this case, the stress to provide sufficient elastic deformation $\Delta t$ becomes excessive. This excessive stress causes problems, such as the breaking of the mounting structure. When the compression modulus E in the operating temperature range from −40° C. to +80° C. during pressing into contact is less than 100 MPa, the deformation becomes excessive. In this case, for example, the conductive film covering the inner resin is broken. In addition, sufficient contact pressure between the bump electrode and the terminal is not provided, and electrical reliability is decreased. Furthermore, the deformation is difficult to be controlled within the range of elastic deformation.

In this case, the compression modulus E of the inner resin during pressing into contact may be 100 to 3,000 MPa. When the compression modulus E of the inner resin is 3,000

MPa or less, a lower load can provide the bump electrode with sufficient elastic deformation. In order to provide the elastic deformation having a sufficient tolerance, the compression modulus E of the inner resin is, may be 100 to 2,000 MPa.

According to an exemplary aspect of the present invention, the sealing resin may be composed of a thermosetting resin. The use of the thermosetting resin as the sealing resin provides the following advantage. The electronic component is pressed on the substrate through the uncured or semi-cured sealing resin such that the bump electrode is brought into conductive contact with the terminal on the substrate. The sealing resin can be cured by heating while maintaining this state. Accordingly, the elastic deformation of the bump electrode is reliably held. In addition, the elastic deformation is accurately determined.

According to an exemplary aspect of the present invention, the substrate and the terminal may be composed of a transparent material. According to this structure, a conductive contact surface formed by the bump electrode and the terminal is visible from the back-side of the substrate. The elastic deformation $\Delta t$ of the bump electrode is estimated by checking some factors, such as the width, the shape, and the area of the conductive contact surface. For example, the relationship between the elastic deformation $\Delta t$ of the bump electrode in the contact direction and some factors, such as the width, the shape, and the area of the conductive contact surface is measured in advance. The elastic deformation $\Delta t$ can be accurately estimated by measuring some factors, such as the width, the shape, and the area of the conductive contact surface from the back-side of the substrate.

According to an exemplary aspect of the present invention, the substrate may be composed of glass or quartz and the terminal may be composed of indium tin oxide (ITO). According to this structure, since the surface of the substrate is sufficiently harder than the inner resin, the substrate is hardly deformed. Accordingly, the elastic deformation $\Delta t$ of the inner resin is controlled more accurately. Furthermore, the relationship between the elastic deformation $\Delta t$ of the inner resin and the electrical reliability becomes more precise. Thus, high electrical reliability can be achieved with a simple structure.

An electro-optic device according to an exemplary aspect of the present invention includes any one of the above mounting structure of an electronic component and an electro-optical panel including the above substrate. Accordingly, an electro-optic device having high electrical reliability is provided. In addition to the liquid crystal display device, examples of the electro-optic device include an electroluminescent device, an organic electroluminescent device, a plasma display device, an electrophoretic display device, and a device using an electron emission element.

Electronic equipment according to an exemplary aspect of the present invention includes, for example, the above electro-optic device and a control unit to control the electro-optic device.

According to an exemplary aspect of the present invention, in a method for mounting an electronic component having a bump electrode on a substrate having a terminal, the method includes forming the bump electrode including a core composed of an elastic inner resin and a conductive film covering the surface of the core; bringing the bump electrode into conductive contact with the terminal directly and elastically deforming the bump electrode by pressing in the contact direction; and filling a sealing resin around the conductive contact portion between the bump electrode and the terminal in the pressured state, the elastic deformation of the bump electrode caused by the pressure being held by the sealing resin.

According to an exemplary aspect of the present invention, the elastic deformation of the bump electrode may be controlled by the pressure during mounting such that the state of elastic deformation of the bump electrode is maintained in the temperature range at least from −40° C. to +80° C.

According to an exemplary aspect of the present invention, the bump electrode may be pressed on the terminal through the sealing resin composed of an uncured or semi-cured thermosetting resin. The sealing resin may be cured in a state where the bump electrode is brought into conductive contact with the terminal directly.

According to an exemplary aspect of the present invention, the surface of the top portion of the bump electrode may be formed flatly when forming the bump electrode. Since this structure provides sufficient contact area between the bump electrode and the terminal, electrical reliability is further enhanced.

According to an exemplary aspect of the present invention, the surface of the top portion of the bump electrode may be formed spherically when forming the bump electrode. According to this structure, the area of the contact surface of the top portion drastically changes according to the change in the elastic deformation $\Delta t$ of the bump electrode. Therefore, the elastic deformation $\Delta t$ of the bump electrode is accurately estimated by measuring the width (diameter) or the area of the contact surface with a simple method. Furthermore, since even a very small elastic deformation of the bump electrode provides sufficient contact area, electrical reliability is enhanced.

According to an exemplary aspect of the present invention, the substrate and the terminal may be composed of a transparent material. This structure allows the contact surface between the bump electrode and the terminal to be observed from the back-side of the substrate. The elastic deformation of the bump electrode is estimated by observing the contact surface. Thus, the elastic deformation is accurately controlled and is checked with a simple method. In this case, the substrate may be composed of glass or quartz and the terminal may be composed of ITO. According to this structure, the accuracy of the elastic deformation of the bump electrode and the effects on the conductive contact due to the elastic deformation are performed with good reproducibility.

Advantages

As described above, a bump electrode including a core composed of an elastic inner resin and conductive film covering the surface of the core is used in an exemplary aspects of the present invention. Exemplary aspects of the present invention provide a mounting structure of an electronic component having high electrical reliability with a low production cost. The electrical reliability is further enhanced by controlling the elastic deformation $\Delta t$ of the bump electrode with high accuracy.

BRIEF DESCRIPTION OF THE DRAWINGS

FIG. 4 is a schematic showing the structure after mounting;

DETAILED DESCRIPTION OF EXEMPLARY EMBODIMENTS

Mounting Structure of Electronic Component and Electro-Optic Device

Figure 1:
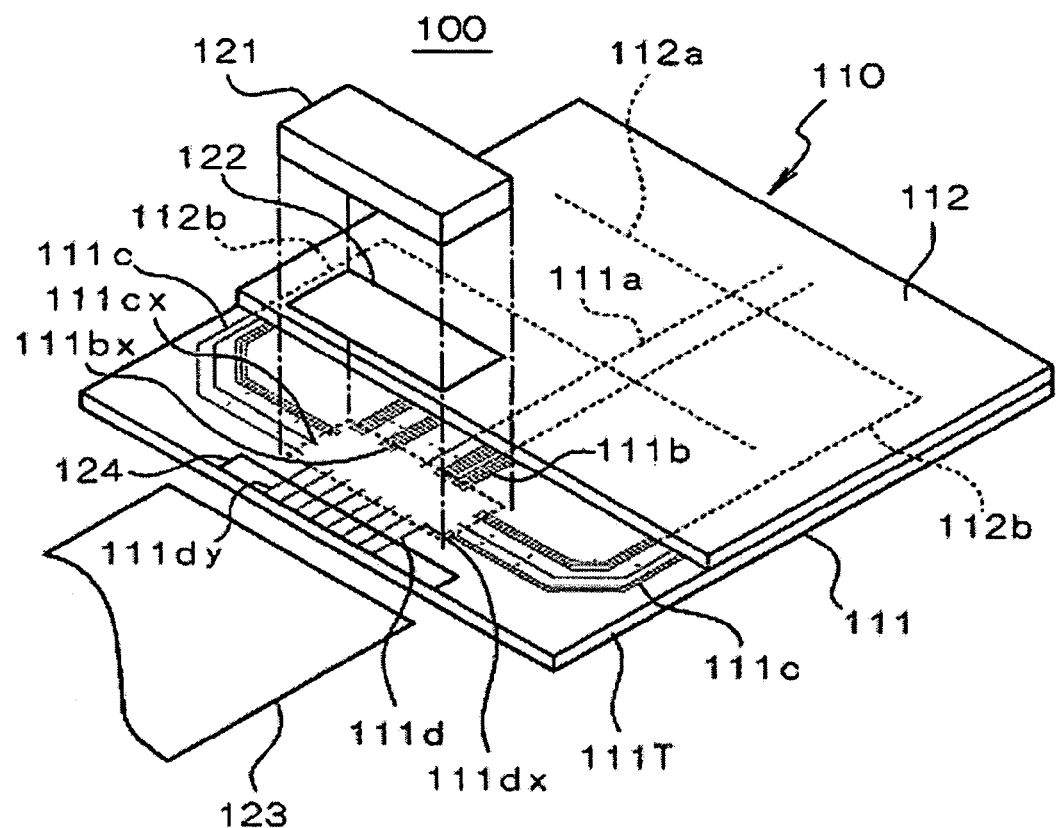
FIG. 1 is a schematic showing a structure of a liquid crystal display device according to an exemplary embodiment of the present invention.

Examples of the present invention will be described with reference to drawings. FIG. 1 is a schematic showing a liquid crystal display device that is an exemplary embodiment of a mounting structure of an electronic component and an electro-optic device according to the present invention.

A liquid crystal display device 100 shown in the figure includes a liquid crystal panel 110 and an electronic component (liquid crystal-driving IC chip) 121. Additional components, such as a polarizer, a reflective sheet, and a backlight (not shown in the figure) are disposed according to need.

The liquid crystal panel 110 includes substrates 111 and 112 composed of, for example, glass or a plastic. The substrate 111 and the substrate 112 are disposed facing each other and bonded with, for example, a sealing member (not shown in the figure). A liquid crystal (not shown in the figure), which is an electro-optic material, is filled between the substrate 111 and the substrate 112. An electrode 111a composed of a transparent conductor, such as indium tin oxide (ITO) is disposed on the inner face of the substrate 111. An electrode 112a facing the electrode 111a is disposed on the inner face of the substrate 112.

The electrode 111a is connected to wiring 111b, which is formed as the same component and is composed of the same material as the electrode 111a. The electrode 111a connected to the wiring 111b is further extended on the inner face of a substrate-protruding part 111T of the substrate 111. The substrate-protruding part 111T is an end of the substrate 111 where the substrate 111 is protruded outside from the periphery of the substrate 112. The leading end of the wiring 111b forms a terminal 111bx. The electrode 112a is also connected to wiring 112b, which is formed as the same component and is composed of the same material as the electrode 112a. The electrode 112a connected to wiring 112b is conductively connected with wiring 111c on the substrate 111 through a vertical conducting portion (not shown in the figure). This wiring 111c is also composed of the same ITO as described above. The wiring 111c is extended on the substrate-protruding part 111T, and the leading end of the wiring 111c forms a terminal 111cx. Input wiring 111d is disposed at the edge of the substrate-protruding part 111T. The inner part of the input wiring 111d forms a terminal 111dx, which is disposed facing the terminals 111bx and 111cx. The outer part of the input wiring 111d forms an input terminal 111dy.

The electronic component 121 is mounted on the substrate-protruding part 111T using a sealing resin 122 composed of an uncured (A stage) or a semi-cured (B stage) thermosetting resin. This electronic component 121 is, for example, a liquid crystal-driving IC chip to drive the liquid crystal panel 110. A large number of bump electrodes (not shown in the figure) are disposed on the undersurface of the electronic component 121. These bump electrodes are conductively connected with the terminals 111bx, 111cx, and 111dx on the substrate-protruding part 111T.

A flexible printed circuit board 123 is mounted on the array area of the input terminal 111dy on the substrate-protruding part 111T through an anisotropic conductive film 124. The input terminal 111dy is conductively connected with a corresponding wiring (not shown in the figure) disposed on the flexible printed circuit board 123. A control signal, a video signal, and a power supply potential, etc. are supplied to the input terminal 111dy from the outside through the flexible printed circuit board 123. The control signal, the video signal, and the power supply potential supplied to the input terminal 111dy are input in the electronic component 121. A driving signal for driving the liquid crystal is generated and is supplied to the liquid crystal panel 110.

According to the liquid crystal display device 100 having the above structure of the present exemplary embodiment, an appropriate voltage is applied between the electrode 111a and the electrode 112a through the electronic component 121. Consequently, light is independently modulated at each pixel on the area where the electrodes 111a and 112a are disposed facing each other. Thus, a desired image is formed on the display area wherein the pixels in the liquid crystal panel 110 are arranged.

Figure 2:
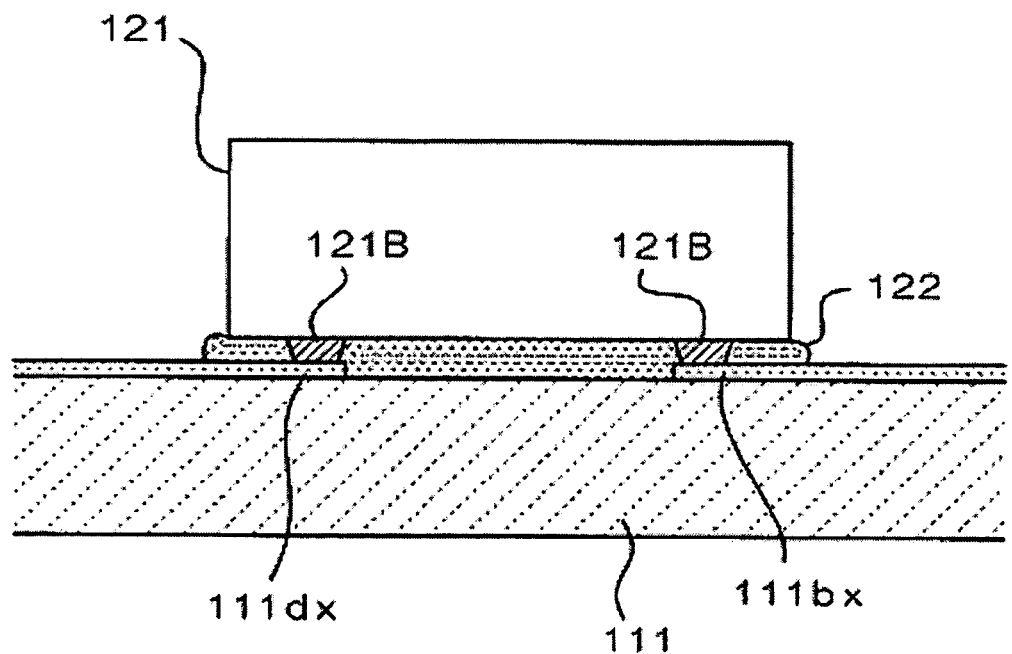
FIG. 2 is a schematic showing a mounting structure according to an exemplary embodiment of the present invention.

FIG. 2 is a schematic showing the mounting structure of the electronic component 121 in the above liquid crystal display device 100. A number of bump electrodes 121B, which are terminals adjacent to the IC, are disposed on the surface (the undersurface in the figure) of the electronic component 121. The ends of the bump electrodes 121B are brought into conductive contact with the terminals 111bx, 111cx, and 111dx (the terminal 111cx is not shown in the figure, see FIG. 1, and so forth) of the substrate 111 directly. A cured sealing resin 122 composed of, for example, a thermosetting resin is filled in around the conductive contact portion between the bump electrodes 121B and the terminals 111bx, 111cx, and 111dx.

Figure 3:
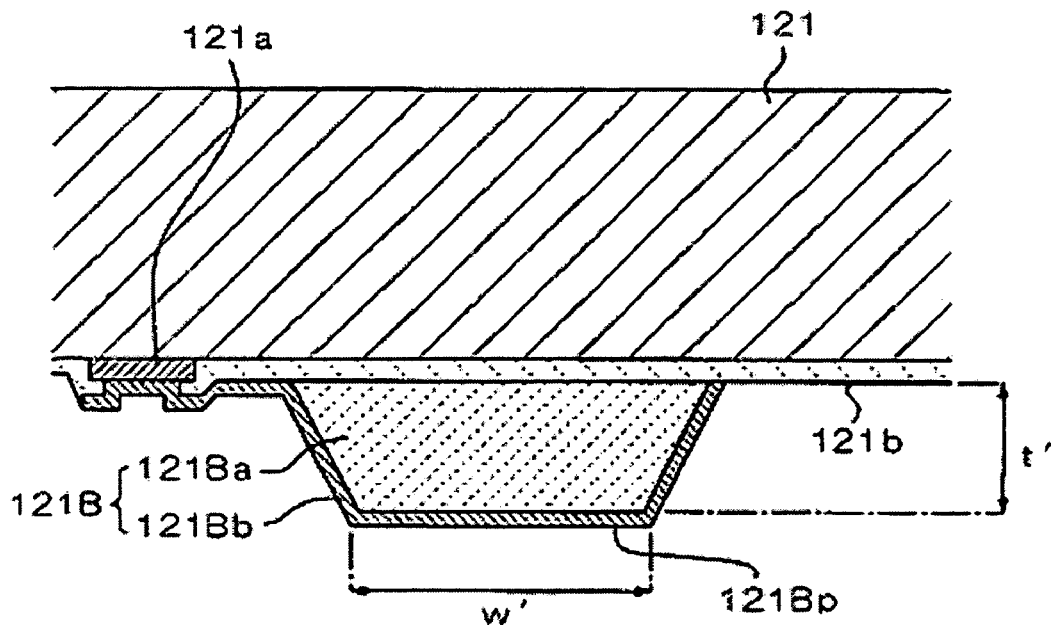
FIG. 3 is a schematic showing the structure before mounting.
Figure 3:
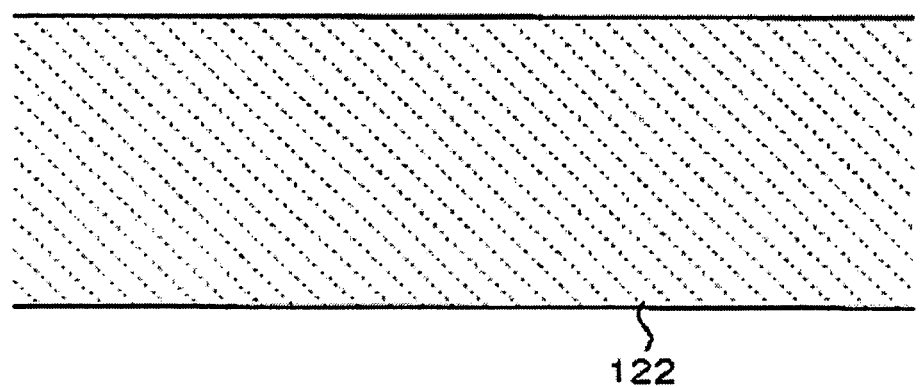
Figure 3:
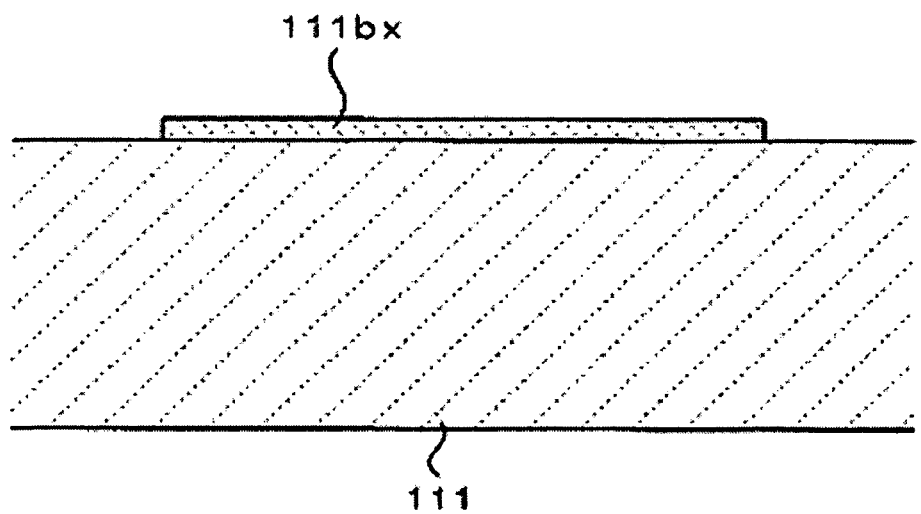

FIG. 3 is a schematic showing the structure of the electronic component 121 before mounting.

FIG. 4 is a schematic showing the structure of the electronic component 121 after mounting. The electronic component 121 is an integrated-circuit chip composed of, for example, a silicon substrate having appropriate circuits thereon. A terminal electrode 121a composed of, for example, aluminum is disposed on the surface (undersurface in the figure) of the electronic component 121. A protective film 121b is formed around the terminal electrode 121a. For example, the protective film 121*b* is a passivation film composed of an insulating material, such as $SiO_2$. The protective film 121*b* covers the surface of the electronic component 121 with the terminal electrode 121*a* being exposed.

An elastic inner resin (bump core) 121Ba is disposed on the protective film 121*b* and away from the terminal electrode 121*a* such that the inner resin 121Ba protrudes from the surface of the electronic component 121. In order to form the inner resin 121Ba, for example, an elastic resin film is coated on the surface of the protective film 121*b*. Subsequently, the elastic resin film is patterned by etching. The surface of the inner resin 121Ba is covered with a conductive film 121Bb. The conductive film 121Bb is conductively connected with the terminal electrode 121*a*. In order to form the conductive film 121Bb, a conductive metal, such as Au, Cu, or Ni is deposited by vapor deposition or sputtering. Subsequently, the metal film is appropriately patterned. The surface of the conductive film, which is an underlayer, composed of, for example, Cu, Ni, or Al may be further coated with, for example, Au plating to enhance the property of the conductive contact.

As described above, the inner resin 121Ba and the conductive film 121Bb form the bump electrode 121B that protrudes from the surface of the electronic component 121. This bump electrode 121B has a trapezoidal shape and is formed so as to protrude from the surface. The bump electrode 121B has a flat top portion 121Bp. Examples of the shape of the bump electrode 121B include a truncated cone, a truncated pyramid, a cylinder, and a prism. In the bump electrode 121B, the height of the inner resin 121Ba is defined as t'. The width (or diameter) of the top portion 121Bp of the bump electrode 121B is defined as w'.

According to the present exemplary embodiment, the above bump electrode 121B is subjected to thermocompression bonding to the terminal 111*bx* on the substrate 111 through the sealing resin 122. The sealing resin 122 is composed of a thermosetting resin. Before the mounting, the thermosetting resin is in an uncured or a semi-cured state. A sealing resin 122 being in an uncured state is applied on the surface (undersurface in the figure) of the electronic component 121 or on the surface of the substrate 111 before mounting. When the sealing resin 122 is in a semi-cured state, a film or a sheet is formed with the semi-cured sealing resin. The resultant film or sheet is inserted between the electronic component 121 and the substrate 111. Epoxy resin is generally used as the sealing resin 122. Any other suitable resins may be used.

The mounting of the electronic component 121 is performed by pressing the electronic component 121 on the substrate 111 while heating using, for example, a thermo-compression head (not shown in the figure). As shown in FIG. 4, in the initial stage, the sealing resin 122 is softened by heating. The top portion 121Bp of the bump electrode 121B pushes away the softened resin and is brought into conductive contact with the terminal 111*bx*. The inner resin 121Ba is elastically deformed in the contact direction (the perpendicular direction in the figure) by the pressure. The heating is continued in this state. Consequently, the sealing resin 122 is crosslinked and cured by heating. Even when the pressure is released, the bump electrode 121B is brought into conductive contact with the terminal 111*bx* with the sealing resin 122 while the bump electrode 121B is elastically deformed. After the electronic component 121 is mounted as described above, a height t of the inner resin 121Ba becomes smaller than the height t' of the inner resin 121Ba before the mounting. In addition, the width w of the bump electrode 121B after the mounting becomes larger than the width w' of the bump electrode 121B before the mounting. After this mounting, the degree of deformation of the bump electrode 121B is within the elastic deformation. Therefore, if the compressive force, which is applied between the electronic component 121 and the substrate 111 by the cured sealing resin 122, is released in any way, the shape of the bump electrode 121B substantially returns to the same shape before the mounting.

Figure 5:
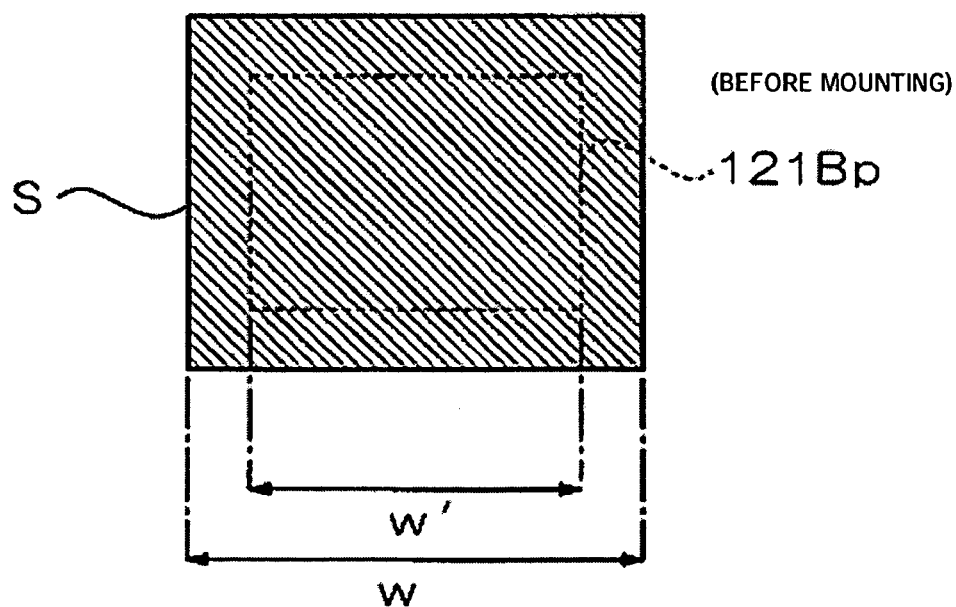
FIG. 5 is a schematic showing a shape of a conductive contact surface after mounting.

Since the substrate 111 composed of, for example, glass and the terminal 111*bx* composed of, for example, ITO are transparent, as shown in FIG. 5, a conductive contact surface S formed by the top portion 121Bp of the bump electrode 121B and the terminal 111*bx* is visible from the back-side of the substrate 111. Therefore, the shape and the width of the top portion 121Bp of the bump electrode 121B after the mounting are readily observed from the back-side of the substrate 111. The width of the conductive contact surface S is equivalent to the width w of the top portion 121Bp of the bump electrode 121B after the mounting, and is larger than the width w' of the top portion 121Bp of the bump electrode 121B before the mounting.

Figure 6:
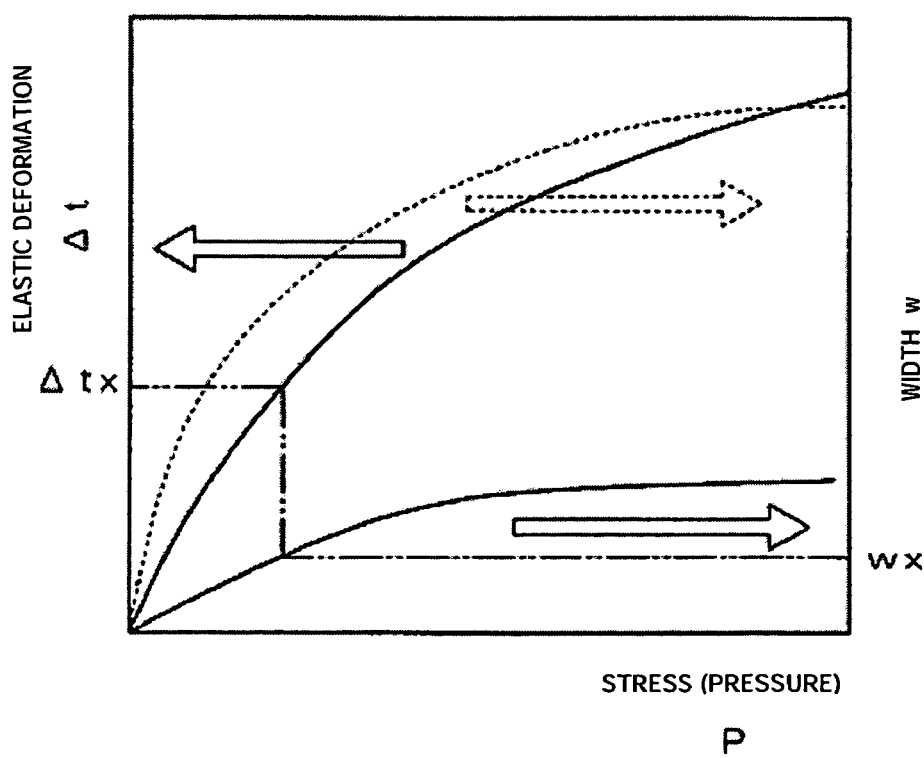
FIG. 6 includes graphs showing the dependency of the elastic deformation $\Delta t$ of a bump electrode and the width w of the top portion to the pressure P.

In general, the width w of the top portion 121Bp of the bump electrode 121B after the mounting and an elastic deformation, i.e. $\Delta t = t' - t$, has a proportionality or another positive correlation. Therefore, the measurement of the width w provides an estimation of the elastic deformation $\Delta t$. Of course, after being mounted, a sample may be cut to observe the cross-section thereof with a microscope. Thus, the elastic deformation $\Delta t$ can be directly measured. The elastic deformation $\Delta t$ can be adjusted by changing the pressure P during mounting. FIG. 6 shows the relationship between the pressure P (stress) during mounting and the elastic deformation $\Delta t$ and the relationship between the pressure P (stress) during mounting and the width w. As shown by the two-dot chain line in the figure, the measurement of a width wx provides an estimation of an elastic deformation $\Delta tx$. Furthermore, the relationship between the pressure P and the elastic deformation $\Delta t$ during mounting is shown by the curve in the figure. Therefore, if this relationship is measured in advance, the elastic deformation $\Delta t$ during mounting can be adjusted by controlling the pressure P. Since the above elastic deformation $\Delta t$ is changed depending on the temperature, in this specification, an elastic deformation measured at a temperature To (hereinafter "reference temperature") is defined as the elastic deformation $\Delta t$. Of course, the temperature during mounting and the reference temperature may be different. The pressure P is determined in view of the difference.

Figure 7:
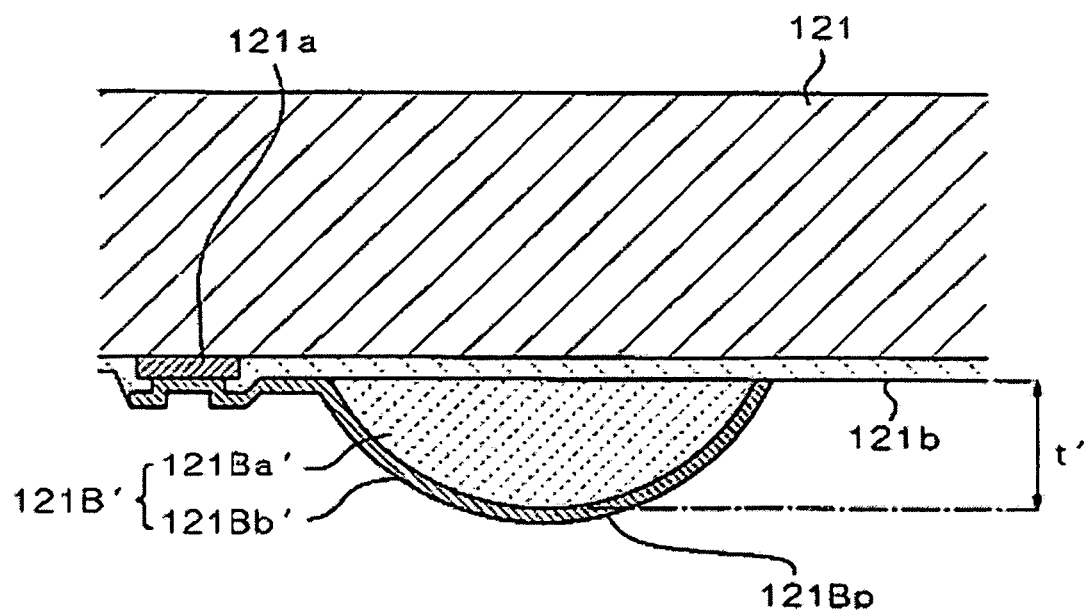
FIG. 7 is a schematic showing a bump electrode having a different shape.

FIG. 7 is a schematic showing a bump electrode 121B' having a different shape from the above. A top portion 121Bp' of this bump electrode 121B' is different from the above exemplary embodiment in that the top portion 121Bp' has a spherical surface. Since the other structures are the same as the above exemplary embodiment, the description of the common parts is omitted. The bump electrode 121B' has a hemispherical shape on the whole. Alternatively, this bump electrode 121B' may have a semi-cylindrical shape on the whole. The bump electrode 121B' is formed by patterning an inner resin as in the above exemplary embodiment, and then softening the inner resin by heating. Thus, the surface of the inner resin is deformed so as to have a convex curve. Alternatively, the inner resin having a desired shape may be formed by applying a photosensitive resin, exposing the photosensitive resin with an adjusted exposure distribution, and developing the photosensitive resin.

Figure 8:
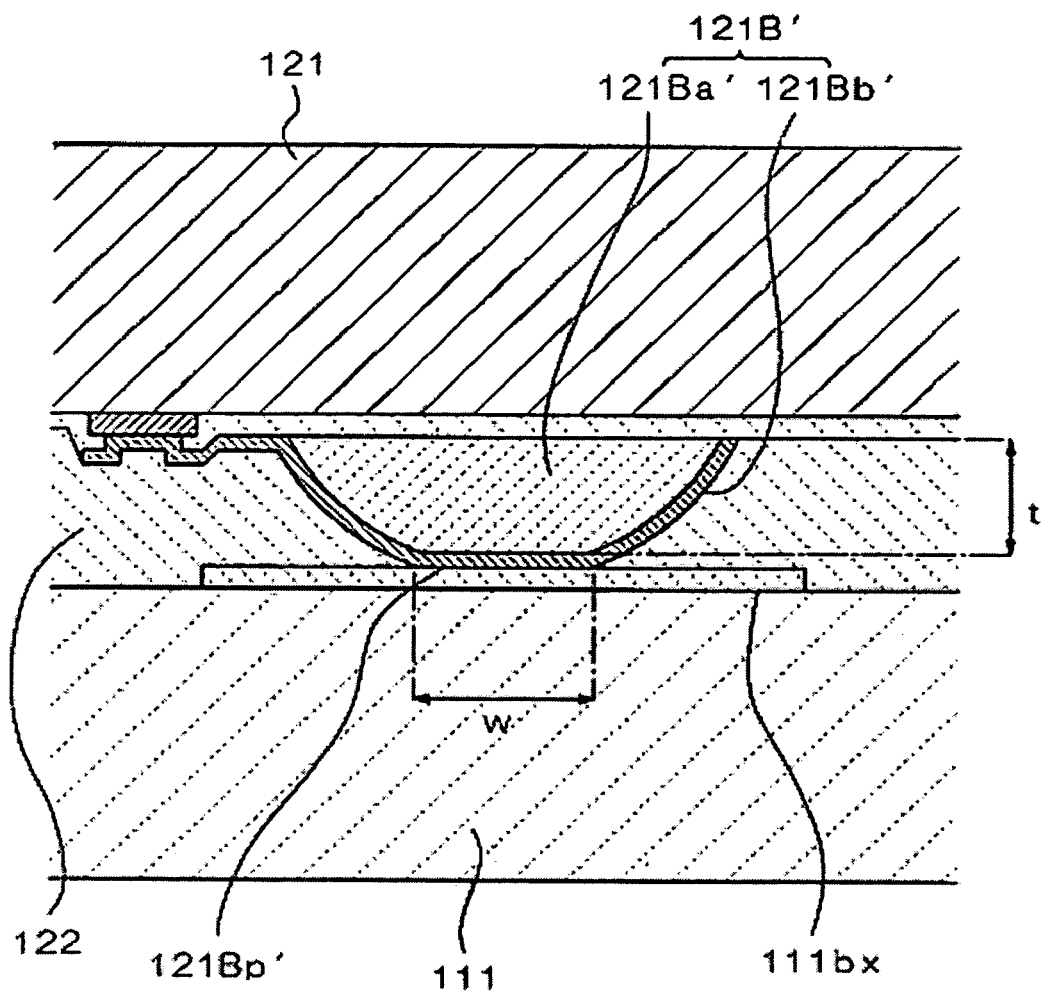
FIG. 8 is a schematic showing a mounting structure including a bump electrode having a different shape.
Figure 9:
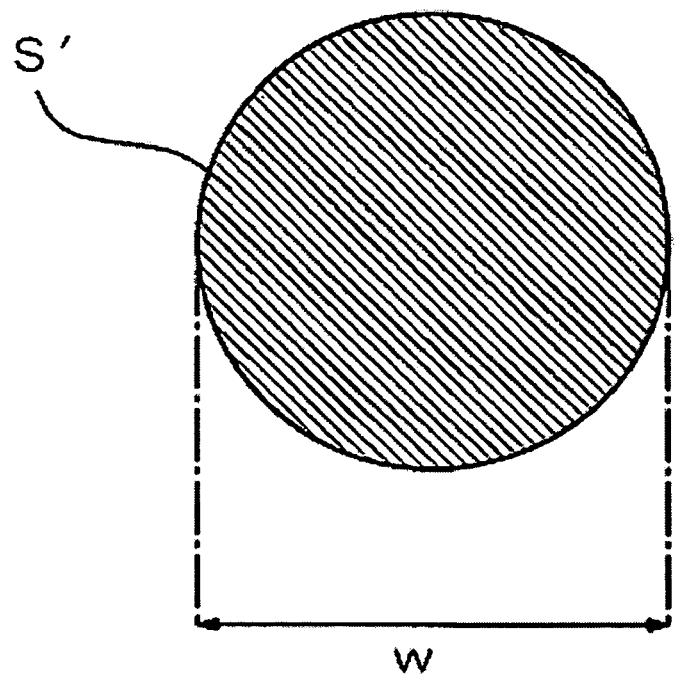
FIG. 9 is a schematic showing a conductive contact surface in the mounting structure including a bump electrode having a different shape.

Since the flat top portion 121Bp described in the above exemplary embodiment provides a large conductive contact surface S, electrical reliability is enhanced. As shown in FIG. 7, when the top portion 121Bp' of the bump electrode 121B' has a spherical surface, the top portion 121Bp' of the bump electrode 121B' is pressed and becomes flat after the mounting as shown in FIG. 8. This structure increases the rate of change of the width w of the flattened top portion 121Bp' to the elastic deformation. Accordingly, as shown in FIG. 9, when the width w is measured by the observation of the conductive contact surface S' viewed from the back-side of the substrate 111, the width w can provide a more accurate elastic deformation $\Delta t$. In other words, as shown by the dotted line in FIG. 6, the slope of the change in the width w to the pressure and the elastic deformation is increased in the range where the elastic deformation is relatively small. Accordingly, this spherical surface structure enhances the accuracy to estimate the elastic deformation $\Delta t$ by measuring the width w.

In addition, the top portion 121Bp' of the bump electrode 121B' having a spherical shape provides the following advantage. Even if the elastic deformation $\Delta t$ of the bump electrode 121B' is relatively small, a certain amount of the conductive contact surface S' is provided. Therefore, the decrease of electrical reliability is suppressed. When the rate of change in the width w to the change in the elastic deformation $\Delta t$ needs to be increased, the area of the conductive contact surface S' is generally decreased in the range where the elastic deformation $\Delta t$ is small. According to this example, however, the surface of the top portion 121Bp' has a spherical shape. In this case, as shown by the dotted line in FIG. 6, the rate of change in the width w is large in the range where the elastic deformation $\Delta t$ is small, and the rate of change in the width w is decreased as the elastic deformation $\Delta t$ is increased. Accordingly, even if the elastic deformation $\Delta t$ is very small, a certain amount of the conductive contact area can be provided.

According to the present exemplary embodiment, the bump electrode 121B is elastically deformed in the contact direction within the temperature range at least from $-40°$ C. to $+80°$ C., which is the general operating temperature range. In the above mounting structure, the following symbols are defined as follows. At a reference temperature To that is appropriately set in the temperature range from $-40°$ C. to $+80°$ C., t represents the height of the inner resin 121Ba, $\Delta t$ represents the elastic deformation of the inner resin 121Ba, $\alpha$ represents the thermal expansion coefficient of the inner resin 121Ba, and $\alpha'$ represents the thermal expansion coefficient of the sealing resin 122. If the thermal expansion coefficients $\alpha$ and $\alpha'$ are constant with the temperature, at a certain temperature T in the above temperature range, a thermal expansion of the inner resin 121Ba is represented by $\alpha \cdot t \cdot \alpha T$ and a thermal expansion of the sealing resin 122 portion corresponding to the height of the inner resin 121Ba is represented by $\alpha' \cdot t \cdot \Delta T$, where $\Delta T = T - T_o$. Accordingly, the difference in the thermal expansion calculated by subtracting the thermal expansion of the inner resin 121Ba from the thermal expansion of the sealing resin 122 is represented by $\Delta \alpha \cdot t \cdot \alpha T$, wherein $\Delta \alpha = \alpha' - \alpha$.

Accordingly, when formula $\Delta t > \Delta \alpha \cdot t \cdot \Delta T$ ... (1) is satisfied, at the certain temperature T, the difference $\Delta \alpha \cdot t \cdot \Delta T$ in the thermal expansion is smaller than the elastic deformation $\Delta t$ at the reference temperature To. In this case, a state where the bump electrode 121B is elastically deformed is maintained. This situation will now be described more specifically. Firstly, when the certain temperature T is higher than the reference temperature To, the relationships between the difference $\Delta \alpha \cdot t \cdot \Delta T$ in the thermal expansion and the temperature T are as follows. When the thermal expansion coefficient of the sealing resin is larger than that of the inner resin ($\alpha < \alpha'$), the difference $\Delta \alpha \cdot t \cdot \Delta T$ in the thermal expansion is positive and is increased as the temperature T is increased. When the thermal expansion coefficient of the sealing resin is smaller than that of the inner resin ($\alpha > \alpha'$), the difference $\Delta \alpha \cdot t \cdot \Delta T$ in the thermal expansion is negative and is decreased as the temperature T is increased. Secondly, when the certain temperature T is lower than the reference temperature T, the relationships between the difference $\Delta \alpha \cdot t \cdot \Delta T$ in the thermal expansion and the temperature T are as follows. When the thermal expansion coefficient of the sealing resin is larger than that of the inner resin ($\alpha < \alpha'$), the difference $\Delta \alpha \cdot t \cdot \Delta T$ in the thermal expansion is negative and is decreased as the temperature T is decreased. When the thermal expansion coefficient of the sealing resin is smaller than that of the inner resin ($\alpha > \alpha'$), the difference $\Delta \alpha \cdot t \cdot \Delta T$ in the thermal expansion is positive and is increased as the temperature T is decreased.

Figure 10:
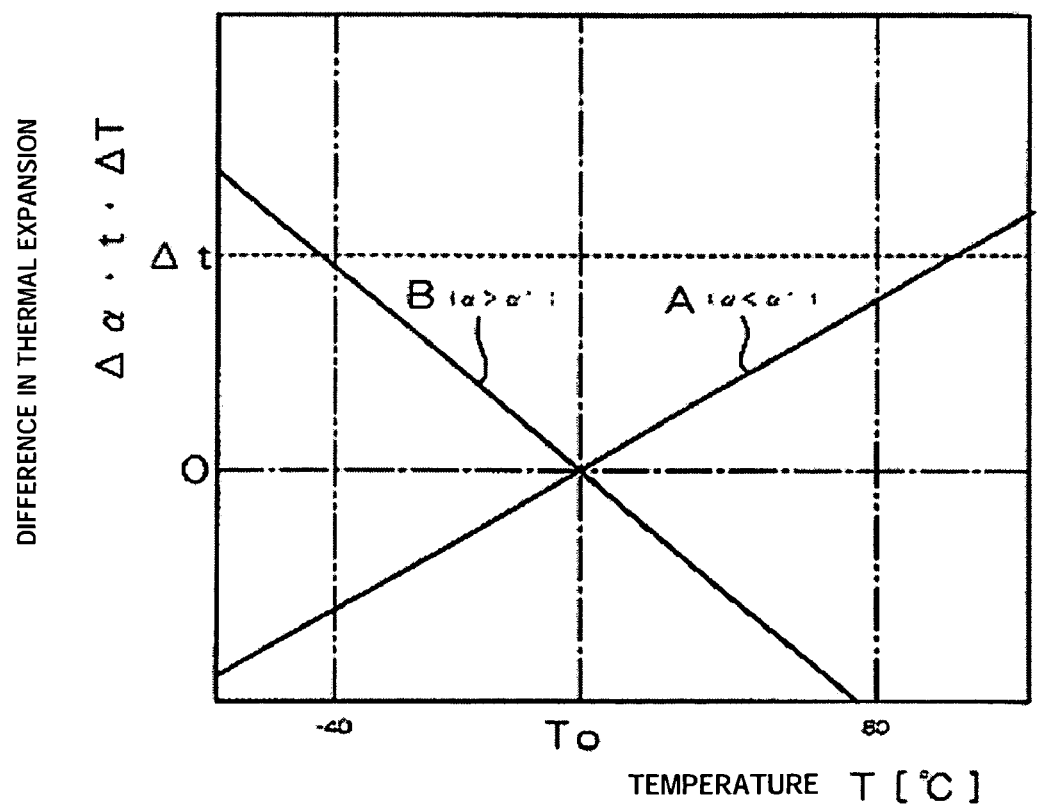
FIG. 10 includes graphs showing the dependency of the difference $\Delta\alpha \cdot t \cdot \Delta T$ in the thermal expansion to the temperature T.
Figure 11:
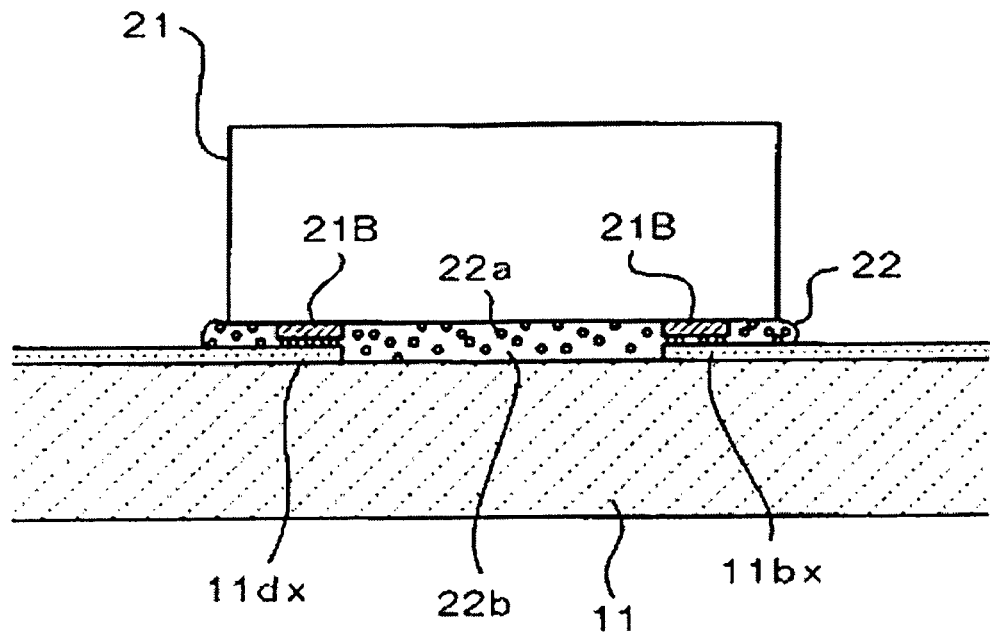
FIG. 11 is a schematic showing a related art mounting structure.

According to the present exemplary embodiment, formula (1) is satisfied in the temperature range at least from $-40°$ C. to $+80°$ C. FIG. 10 shows this relationship. In FIG. 10, the abscissa represents the temperature T [° C.] and the ordinate represents the difference $\Delta \alpha \cdot t \cdot \Delta T$ in the thermal expansion. The elastic deformation $\Delta t$ shown in the figure represents the elastic deformation of a bump electrode 121B at the reference temperature To. Although the reference temperature To may be any temperature in the above temperature range, the reference temperature To is generally a room temperature, for example, 20° C. FIG. 10 separately shows graph A and graph B. Graph A shows case A in which the thermal expansion coefficient of the sealing resin is larger than that of the inner resin ($\alpha < \alpha'$). Graph B shows case B in which the thermal expansion coefficient of the sealing resin is smaller than that of the inner resin ($\alpha > \alpha'$). In each of case A and case B, the slope in graph A and graph B is proportional to the absolute value of the difference $\Delta c$ in the thermal expansion coefficient. When the thermal expansion coefficient of the inner resin and that of the sealing resin are substantially the same value, graph A and graph B become substantially horizontal. In this case, the absolute value of the difference $\Delta \alpha \cdot t \cdot \Delta T$ in the thermal expansion is close to zero and the value hardly depends on the temperature.

Referring to both graph A and graph B shown in FIG. 10, in the temperature range at least from $-40°$ C. to $+80°$ C., the difference $\Delta \alpha \cdot t \cdot \Delta T$ in the thermal expansion is less than the elastic deformation $\Delta t$ at the reference temperature To. In each of case A and case B, when the slope of the graph, i.e., the absolute value of the difference $\Delta \alpha$ in the thermal expansion coefficient is small on some level, it is easy to maintain the elastic deformation of the bump electrode 121B at least in the above temperature range. According to the present exemplary embodiment, the elastic deformation $\Delta t$ of the bump electrode 121B at the reference temperature To is controlled such that the elastic deformation $\Delta t$ is larger than the difference $\Delta \alpha \cdot t \cdot \Delta T$ in the thermal expansion in the temperature range at least from $-40°$ C. to $+80°$ C. In this case, if the difference $\Delta \alpha$ in the thermal expansion coefficient between the inner resin and the sealing resin is small, the elastic deformation $\Delta t$ can be controlled to a small value. Accordingly, the pressure P during the mounting can be controlled to a small value.

When the lower limit of the above temperature range (for example, $-40°$ C.) is used as the reference temperature To, the following formula is used. When a width $\delta T$ in the above temperature range (for example, 80° C.–($-40°$ C.)=120° C.)

is used, it is sufficient that formula (1) is satisfied at the upper limit of the above temperature range. Accordingly, formula $\Delta t > \Delta \alpha \cdot t \cdot \delta T \ldots (2)$ can be used. In this case, when formula (2) is satisfied, the bump electrode 121B is elastically deformed for the above entire temperature range.

In this case, the difference $\Delta \alpha$ in the thermal expansion coefficient is used in formula (2). In reality, however, when formula $\Delta t > \alpha' \cdot t \cdot \delta T \ldots (3)$ (wherein only the thermal expansion coefficient $\alpha'$ of the sealing resin is used instead of $\Delta \alpha$) is satisfied, a reliable conductive connection can be satisfactorily maintained.

When the thermal expansion coefficient $\alpha$ of the inner resin 121Ba is larger than or equal to the thermal expansion coefficient $\alpha'$ of the sealing resin 122, in addition, when the repulsive force to suppress the expansion of the inner resin 121Ba during pressing with heat is larger than the contractive force of the inner resin 121Ba at the reference temperature To, the elastic deformation of the bump electrode is reliably maintained. In this case, when an elastic deformation $\Delta t$ is provided at a certain temperature, the elastic deformation of the bump electrode is reliably maintained at a temperature higher than the certain temperature. For example, as described above, when an elastic deformation $\Delta t$ is provided at the lower limit temperature in the temperature range, the elastic deformation of the bump electrode is maintained for the entire temperature range that exceeds the lower limit temperature.

When the thermal expansion coefficient $\alpha$ of the inner resin is smaller than or equal to the thermal expansion coefficient $\alpha'$ of the sealing resin, the elastic deformation of the bump electrode is maintained as follows. When an elastic deformation $\Delta t$ is provided at a certain temperature, the elastic deformation of the bump electrode is reliably maintained at a temperature lower than the certain temperature.

Formula (1) is satisfied on the assumption that the thermal expansion coefficients $\alpha$ and $\alpha'$ do not depend on the temperature. When the thermal expansion coefficients $\alpha$ and $\alpha'$ depend on the temperature, and consequently, the $\Delta \alpha$ also depends on the temperature, formula (1) is expanded and the following mathematical formula can be used.

Mathematical Formula 2

$$\Delta t > \int_{T_o}^{T_o + \Delta T} \Delta \alpha t \, dT$$

That is, instead of the difference $\Delta \alpha \cdot t \cdot \Delta T$ in the thermal expansion, a value may be used in which $\Delta \alpha \cdot t$ is integrated with respect to temperature T from a reference temperature To a certain temperature $T = T_o + \Delta T$. In this formula, the use of $\delta T$ instead of $\Delta T$ provides an expanded formula of formula (2). Furthermore, the use of $\alpha'$ and $\delta T$ instead of $\Delta \alpha$ and $\Delta T$, respectively, provides an expanded formula of formula (3).

Under the above conditions, the lower limit of the elastic deformation $\Delta t$ of the bump electrode 121B at the reference temperature To is determined by the difference $\Delta \alpha \cdot t \cdot \Delta T$ in the thermal expansion in the above temperature range. Accordingly, the larger elastic deformation $\Delta t$ is more preferable. In reality, however, the elastic deformation $\Delta t$ has an upper limit because the initial height t' of the inner resin 121Ba is used as the standard. For example, as the elastic deformation $\Delta t$ is increased, the pressure P during the mounting is also increased. Therefore, a part of the mounting structure is unfortunately broken by the pressure P.

In general, when the pressure P (stress) exceeds 200 [MPa], for example, the protective film 121b and a silicon substrate in a semiconductor IC are broken with a strong possibility. Therefore, formula $200 \, [\text{MPa}] \cdot t'/E > \Delta t \ldots (4)$, where E represents a compression modulus (i.e., compressive elastic modulus) of the inner resin 121Ba, is preferably satisfied. Since stress $\sigma$ is represented by formula $\epsilon = \sigma \cdot E$ (wherein $\epsilon$ represents strain), the strain $\epsilon$ corresponding to the stress $\sigma$ is represented by formula $\epsilon = \sigma/E$. Therefore, the amount of compression corresponding to the stress $\sigma$ is represented by formula $\epsilon \cdot t' = \sigma \cdot t'/E$. Accordingly, when formula (4) is satisfied, the elastic deformation $\Delta t$ is smaller than the amount of compression corresponding to the stress of $\sigma = 200$ [MPa]. Consequently, the likelihood of the breaking of the mounting structure can be reduced or eliminated.

In the calculation of formula (4) regarding a mounting structure that has been already formed, when the elastic deformation $\Delta t$ is sufficiently smaller than the height of the inner resin 121Ba, the initial height t' may be replaced with the height t after the mounting. This replacement hardly affects the value. Accordingly, it suffices only to satisfy formula $200 \, [\text{MPa}] \cdot t/E > \Delta t \ldots (5)$.

The structure of Examples will now be described in more detail. Table 1 shows the compression modulus of various resins that can be used as the inner resin 121Ba or 121Ba'. Table 2 shows reference calculation conditions for calculating formula (3).

TABLE 1

| Resin | Elastic modulus [MPa] |
|---|---|
| Silicone resin | 100–1,000 |
| Polyimide resin | 2,000–3,000 |
| Acrylic resin | 2,000–3,000 |
| Epoxy resin | 3,000–4,000 |
| Epoxy resin (containing silica filler) | 3,000–15,000 |

TABLE 2

| Reference calculation conditions | Explanation |
|---|---|
| w' = 20 μm | Width (diameter) of top portion of bump |
| t' = 20 μm | Initial height of inner resin |
| α' = 60 ppm/° C. | Thermal expansion coefficient of sealing resin |
| δT = 120° C. | Width of temperature range in operating environment |

The upper limit and the lower limit of the elastic deformation $\Delta t$ are calculated by formula (3) using the resins shown in Table 1 as the inner resin and using the reference calculation conditions shown in Table 2. Table 3 shows the results.

TABLE 3

| Elastic modulus E of resin used | Upper limit of elastic deformation | Elastic deformation | Lower limit of elastic deformation |
|---|---|---|---|
| 100 MPa | 20 μm or more | $\Delta t = t' - t$ | 0.144 μm |
| 2,000 MPa | 2 μm | | |
| 4,000 MPa | 1 μm | | |
| 15,000 MPa | 0.267 μm | | |

According to the above results, when the compression modulus E of the inner resin is 15,000 MPa or less, the bump electrode can be elastically deformed with a pressure P of 200 MPa or less during thermocompression. When the compression modulus E of the inner resin is 100 MPa or less, the inner resin is so soft that the bump electrode is excessively deformed. In this case, for example, the conductive film covering the inner resin is unintentionally broken. In addition, sufficient contact pressure between the bump electrode and the terminal is not provided, and electrical reliability is decreased. Furthermore, in some cases, the deformation of the bump electrode cannot be controlled within the range of elastic deformation with a normal pressure P.

Compared with an inner resin having the compression modulus E of 15,000 MPa, an inner resin having the compression modulus E of 4,000 MPa is preferable; an inner resin having the compression modulus E of 2,000 MPa is more preferable. Since the inner resin having smaller compression modulus causes elastic deformation with a lower load during thermocompression, the processing can be readily performed. In addition, the damage of the mounting structure can also be reduced or prevented. In general, when the compression modulus E is 3,000 MPa or less, sufficient amount of elastic deformation $\Delta t$ can be provided without applying overload. In particular, when the compression modulus E is 2,000 MPa or less, the elastic deformation $\Delta t$ having a sufficient tolerance can be determined.

The thermal expansion coefficient of the inner resin and the sealing resin significantly depends on the manufacturing conditions and additives, even if the resins are composed of the same kind of base resin. For example, among the resins shown in Table 1, a relatively soft resin, such as a silicone resin, a polyimide resin, or an acrylic resin has a thermal expansion coefficient of about 60 to about 200 ppm/° C. and a relatively hard resin, such as an epoxy resin has a thermal expansion coefficient of about 10 to about 60 ppm/° C. In particular, as described above, the use of inner resin and sealing resin having the similar thermal expansion coefficient decreases the value $\Delta\alpha$. Thus, the elastic deformation of the bump electrode can be reliably maintained in a wide temperature range. For this purpose, an epoxy resin is used as the inner resin and the sealing resin.

Although the bump electrode 121B is elastically deformed in the contact direction in the operation temperature range from −40° C. to +80° C. in the present exemplary embodiment, the present invention is not limited to the above. The bump electrode 121B may be heated and pressed into contact in the temperature range from +80° C. to +300° C. In this case, the compression modulus E of the inner resin 121Ba during pressing into contact maybe 10 to 100 MPa.

Thus, sufficient elastic deformation for maintaining the elastic deformation state is provided. Furthermore, in the above temperature range, sufficient contact pressure between the bump electrode and the terminal is provided without problems, such as the breaking of the inner conductive film due to excessive deformation. Accordingly, electrical reliability is provided. In addition, the deformation can be controlled within the range of elastic deformation.

Electronic Equipment

Figure 12:
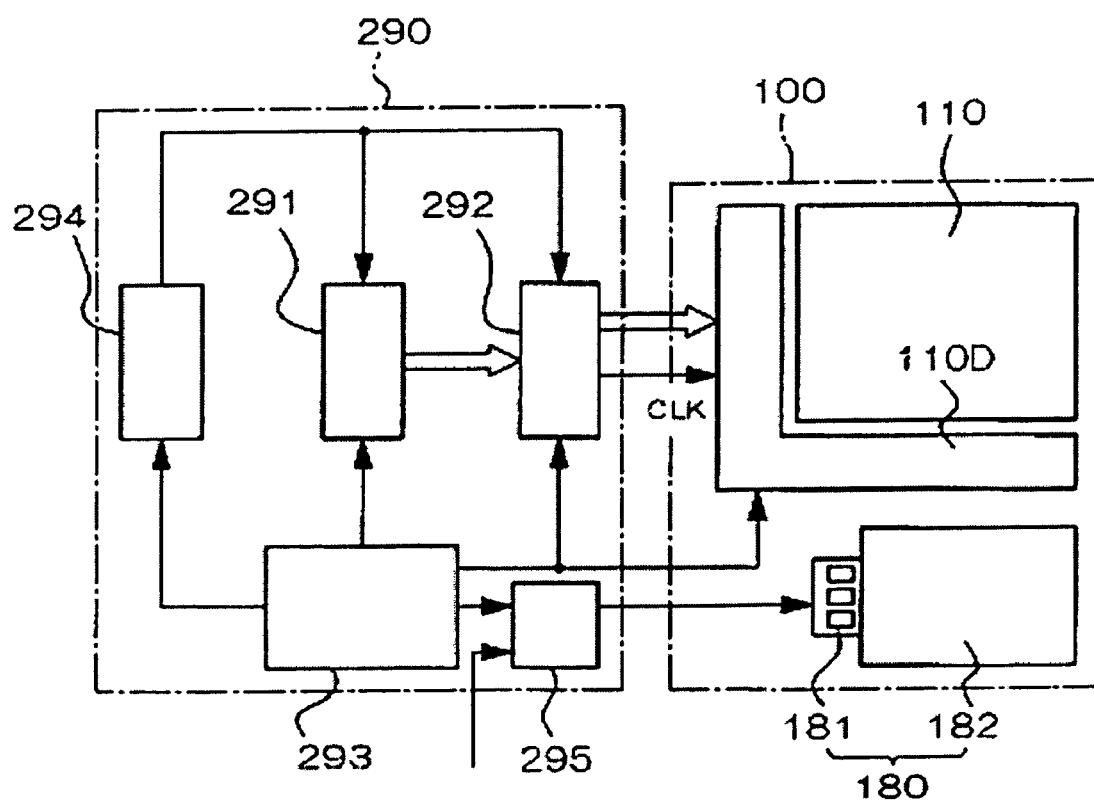
FIG. 12 is a schematic showing a display control system of electronic equipment including an electro-optic device.

Finally, an exemplary embodiment of electronic equipment according to the present exemplary invention will now be described with reference to FIGS. 12 and 13. In the present exemplary embodiment, electronic equipment including the above electro-optic device (liquid crystal display device 100) as a display device will now be described. FIG. 12 is a schematic showing an overall structure of the control system (display control system) of the liquid crystal display device 100 in the electronic equipment of the present exemplary embodiment. The electronic equipment shown in the figure includes a display control circuit 290 having a display information output source 291, a display information processing circuit 292, a power supply circuit 293, a timing generator 294, and a light source control circuit 295. The liquid crystal display device 100 includes a driving circuit 110D for driving a liquid crystal panel 110 having the above-mentioned structure. This driving circuit 110D is composed of a semiconductor IC chip that is directly mounted on the liquid crystal panel 110 as described above. In addition to the above structure, the driving circuit 110D may be a circuit pattern formed on the surface of the panel, a semiconductor IC chip mounted on a circuit board that is conductively connected with the liquid crystal panel, or a circuit pattern formed on the circuit board.

The display information output source 291 includes memories composed of, for example, a read only memory (ROM) and a random access memory (RAM); a storage unit composed of, for example, a magnetic recording disc and an optical recording disc; and a tuning circuit to perform tuned output of digital image signals. The display information output source 291 provides the display information processing circuit 292 with display information in a form of, for example, image signals having a predetermined format, based on various clock signals generated by the timing generator 294.

The display information processing circuit 292 includes known various circuits, such as a serial-parallel conversion circuit, an amplifier/inverter circuit, a rotation circuit, a gamma correction circuit, and a clamping circuit. The display information processing circuit 292 processes the input display information and provides the driving circuit 110D with the image information along with a clock signal CLK. The driving circuit 110D includes a scanning line-driving circuit, a signal line-driving circuit, and an inspection circuit. The power supply circuit 293 provides each of the above components with a predetermined voltage.

The light source control circuit 295 provides a light source portion 181 (specifically, for example, a light-emitting diode) of a lighting element 180 with an electrical power supplied from the power supply circuit 293, based on a control signal introduced from the outside. This light source control circuit 295 controls lighting/non-lighting of each light source of the light source portion 181 depending on the control signal. Furthermore, the light source control circuit 295 can control the luminance of each light source. Light radiated from the light source portion 181 enters the liquid crystal panel 110 through a light guide plate 182.

Figure 13:
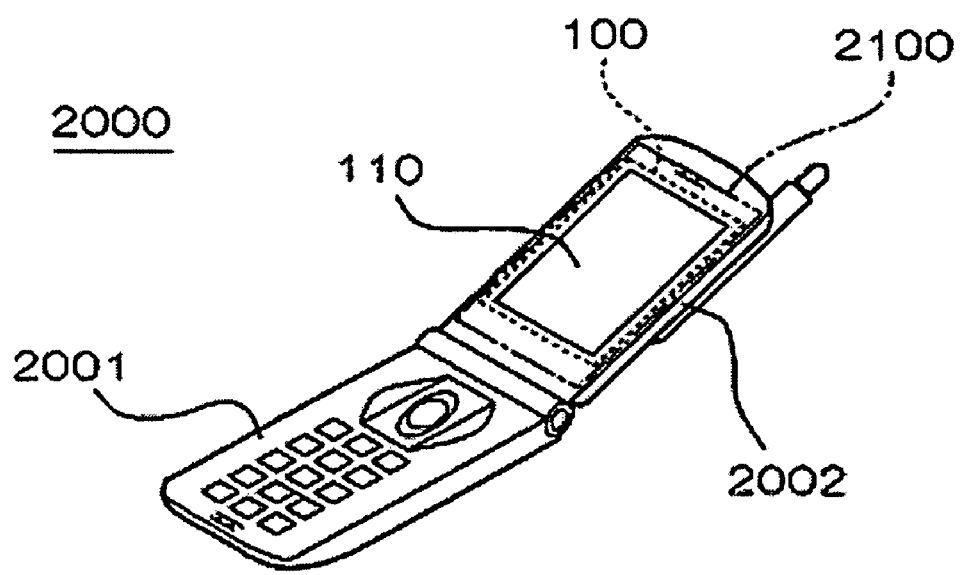
FIG. 13 is a schematic of electronic equipment according to exemplary embodiments of the present invention.

FIG. 13 shows a schematic of a mobile phone, which is an exemplary embodiment of electronic equipment according to the present invention. The electronic equipment 2000 includes an operating portion 2001 and a display portion 2002 having a circuit board 2100. The above liquid crystal display device 100 is mounted on the circuit board 2100. The liquid crystal panel 110 is visible on the surface of the display portion 2002.

In addition to an example of a passive matrix liquid crystal display device shown in the figure, the electro-optic device of an exemplary aspect of the present invention is applicable to an active matrix liquid crystal display device (for example, a liquid crystal display device including a thin film transistor (TFT) or a thin film diode (TFD) as a switching element). Also, in addition to the liquid crystal display device, an exemplary aspect of the present invention is applicable to various electro-optic devices, such as an electroluminescent device, an organic electroluminescent device, a plasma display device, an electrophoretic display device, and a device using an electron emission element (for example, a field emission display and a surface-conduction electron-emitter display).

What is claimed is:

1. A mounting structure of an electronic component, comprising:
   a first substrate;
   a protective layer formed on the first substrate from an electronic insulating material;
   a second subsrate having a terminal;
   a bump electrode disposed on the first substrate, the bump electrode including a core composed of an inner resin and a conductive film covering a surface of the core, the core being in direct contact with the protective layer, disposed in substantial overlap with the protective layer in plan view, and seperated from the first substrate by the protective layer, the bump electrode being brought into conductive contact with the terminal directly so that the bump electrode is elastically flattened against the terminal; and
   a sealing resin filled in around a conductive contact portion between the bump electrode and the terminal to hold the bump electrode and the terminal.

2. The mounting structure of an electronic component according to claim 1, the sealing resin comprising a thermosetting resin.

3. The mounting structure of an electronic component according to claim 1, the substrate and the terminal comprising a transparent material.

4. The mounting structure of an electronic component according to claim 3, the substrate comprising glass or quartz and the terminal comprising indium tin oxide (ITO).

5. An electro-optic device, comprising:
   a mounting structure of an electronic component according to claim 1; and
   an electro-optical panel comprising the substrate.

6. Electronic equipment, comprising:
   the electro-optic device according to claim 5; and
   a control unit to control the electro-optic device.

7. A mounting structure of an electronic component according to claim 1, further including a terminal disposed on the first substrate at a position shifted from the position of the core, the terminal of the first substrate, the conductive film of the bump electrode, and the terminal on the second substrate being electrically connected together.

8. A mounting structure of an electronic component, comprising:
   a substrate having a terminal;
   a bump electrode mounted on the substrate, the bump electrode including a core composed of an inner resin and a conductive film covering a surface of the core, the bump electrode being brought into conductive contact with the terminal directly and the bump electrode being elastically deformed to make contact with a face of the substrate in a planar manner, a compression modulus E of the inner resin during pressing into contact being 10 to 100 MPa;
   a sealing resin filled in around a conductive contact portion between the bump electrode and terminal to hold the bump electrode and the terminal; and
   the bump electrode being brought into conductive contact with the terminal directly, and the bump electrode being elastically deformed by pressing in a contact direction in a temperature range from +80° C. to +300° C.

9. A mounting structure of an electronic component, comprising:
   a substrate having a terminal;
   a bump electrode mounted on the substrate, the bump electrode including a core composed of an inner resin and a conductive film covering a surface of the core, the bump electrode being brought into conductive contact with the terminal directly and the bump electrode being elastically deformed to make contact with a face of the substrate in a planar manner;
   a sealing resin filled in around a conductive contact portion between the bump electrode and the terminal to hold the bump electrode and the terminal and
   the bump electrode being brought into conductive contact with the terminal directly, and the bump electrode being elastically deformed by pressing in a contact direction in a temperature range at least from −40° C. to +80° C.

10. The mounting structure of an electronic component according to claim 9, a mathematical formula 1 being satisfied in the temperature range at least from −40° C. to +80° C.:

Mathematical formula 1

$$\Delta t > \int_{T_o}^{T_o+\Delta T} \Delta \alpha t \, dT$$

Δα representing a difference in a thermal expansion coefficient calculated by subtracting a thermal expansion coefficient α of the inner resin from a thermal expansion coefficient α' of the sealing resin, t representing a height of the inner resin at a reference temperature To set in the temperature range from −40° C. to +80° C., Δt representing an elastic deformation of the bump electrode at the reference temperature To, and ΔT representing a difference in temperature calculated by subtracting the reference temperature To from a certain temperature T.

11. The mounting structure of an electronic component according to claim 10, the thermal expansion coefficient α' of the sealing resin being larger than the thermal expansion coefficient α of the inner resin.

12. The mounting structure of an electronic component according to claim 10,
   the thermal expansion coefficient α of the inner resin being larger than the thermal expansion coefficient α' of the sealing resin; and
   a repulsive force to suppress expansion of the inner resin during pressing with heat being larger than a contractive force of the inner resin at the reference temperature To.

13. The mounting structure of an electronic component according to claim 10, formula 200 [MPa]·t'/E>Δt being satisfied in the temperature range at least from −40° C. to +80° C., E representing a compression modulus of the inner resin and t' representing an initial height of the inner resin.

14. The mounting structure of an electronic component according to claim 9, a compression modulus E of the inner resin during pressing into contact being 100 to 15,000 MPa.

15. The mounting structure of an electronic component according to claim 14, the compression modulus E of the inner resin during pressing into contact being 100 to 3,000 MPa.

16. A method for mounting an electronic component having a bump electrode on a first substrate and a second substrate having a terminal, the method comprising:

forming a protective layer on the first substrate from an electrically insulating material;

forming the bump electrode to include a core composed of an elastic inner resin and a conductive film covering a surface of the core, the core being in direct contact with the protective layer, disposed in substantial overlap with the protective layer in plan view, and separated from the first substrate by the protective layer;

bringing the bump electrode into conductive contact with the terminal directly, and elastically deforming the bump electrode by pressing in the contact direction; and filling a sealing resin around a conductive contact portion between the bump electrode and the terminal in a pressured state, the elastic deformation of the bump electrode caused by the pressure being held by the sealing resin.

17. The method for mounting an electronic component according to claim 16, further comprising:

pressing the bump electrode on the terminal through the sealing resin composed of an uncured or semi-cured thermosetting resin; and curing the sealing resin in a state where the bump electrode is brought into conductive contact with the terminal directly.

18. The method for mounting an electronic component according to claim 16, forming the surface of the top portion of the bump electrode flatly in forming the bump electrode.

19. The method for mounting an electronic component according to claim 16, the substrate and the terminal comprising a transparent material.

20. The method for mounting an electronic component according to claim 19, the substrate comprising glass or quartz and the terminal comprising indium tin oxide (ITO).

21. A method for mounting an electronic component having a bump electrode on a substrate having a terminal, the method comprising:

forming the bump electrode to include a core composed of an elastic inner resin and a conductive film covering a surface of the core;

bringing the bump electrode into conductive contact with the terminal directly, and elastically deforming the bump electrode by pressing in the contact direction;

filling a sealing resin around a conductive contact portion between the bump electrode and the terminal in a pressured state, the elastic deformation of the bump electrode caused by the pressure being held by the sealing resin; and controlling the elastic deformation of the bump electrode by the pressure during mounting such that the state of elastic deformation of the bump electrode is maintained in the temperature range at least from −40° C. to +80° C.

* * * * *